(12) United States Patent
Castle et al.

(10) Patent No.: US 6,800,494 B1
(45) Date of Patent: Oct. 5, 2004

(54) METHOD AND APPARATUS FOR CONTROLLING COPPER BARRIER/SEED DEPOSITION PROCESSES

(75) Inventors: Howard Ernest Castle, Austin, TX (US); William S. Brennan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/150,320

(22) Filed: May 17, 2002

(51) Int. Cl.[7] ............................................... H01L 21/66
(52) U.S. Cl. ............................... 438/14; 438/15; 438/16
(58) Field of Search .......................... 438/14–17, 687, 438/633, 692, 401, 12, 18, 4–7; 257/797; 451/5–6

(56) References Cited

U.S. PATENT DOCUMENTS

| | | | | |
|---|---|---|---|---|
| 5,847,459 | A | * 12/1998 | Taniguchi ................... | 257/751 |
| 6,057,171 | A | * 5/2000 | Chou et al. .................. | 438/15 |
| 6,110,752 | A | * 8/2000 | Litvak ........................... | 438/8 |
| 6,127,196 | A | * 10/2000 | Butera et al. ................ | 438/15 |
| 6,204,167 | B1 | * 3/2001 | Taniguchi ................... | 438/627 |
| 6,268,224 | B1 | * 7/2001 | Miller et al. ................. | 438/10 |
| 6,274,478 | B1 | * 8/2001 | Farkas et al. ............... | 438/626 |
| 6,294,396 | B1 | * 9/2001 | Nogami et al. ............. | 438/16 |
| 6,296,548 | B1 | * 10/2001 | Wiswesser et al. ........... | 451/8 |
| 6,347,977 | B1 | * 2/2002 | Frost ............................. | 451/6 |
| 6,379,982 | B1 | * 4/2002 | Ahn et al. .................... | 438/14 |
| 6,486,036 | B1 | * 11/2002 | Miethke et al. ............. | 438/401 |
| 6,489,240 | B1 | * 12/2002 | Iacoponi et al. ............ | 438/687 |
| 6,534,328 | B1 | * 3/2003 | Hewett et al. ................. | 438/8 |
| 6,562,635 | B1 | * 5/2003 | Lensing et al. ............... | 451/6 |

* cited by examiner

Primary Examiner—John Nebling
Assistant Examiner—Olivia T. Luk
(74) Attorney, Agent, or Firm—Williams, Morgan & Amerson, P.C.

(57) ABSTRACT

The present invention is generally directed to various methods of controlling copper barrier/seed deposition processes, and a system for accomplishing same. In one illustrative embodiment, the method comprises performing at least one process operation to form a barrier metal layer and a copper seed layer above a wafer, sensing at least one parameter of at least one process operation and determining an acceptability metric for the barrier metal layer and the copper seed layer based upon the sensed at least one parameter. In some embodiments, the method further comprises modifying at least one parameter of said at least one process operation to be performed to form a barrier metal layer and a copper seed layer on a subsequently processed wafer based upon said determined acceptability metric. In some embodiments, the method further comprises identifying a wafer as unacceptable if said acceptability metric falls below a preselected level. In some embodiments, the acceptability metric may be determined by accessing a model that correlates the sensed parameter(s) to an acceptability metric for the barrier metal layer and the copper seed layer. In one embodiment, the system is comprised of a process tool that is adapted to perform at least one process operation, e.g., an etch process, a degas process, a barrier metal deposition process and/or a copper seed deposition process, to form a barrier metal layer and a copper seed layer. The system further comprises a controller that is adapted to access a model to determine an acceptability metric for the barrier metal layer and copper seed layer based upon at least one sensed process parameter for at least one of the process operations performed in forming the barrier metal layer and copper seed layer.

63 Claims, 5 Drawing Sheets

Figure 1

(Prior Art)

METHOD AND APPARATUS FOR CONTROLLING COPPER BARRIER/SEED DEPOSITION PROCESSES

BACKGROUND OF THE INVENTION

1. Field of the Invention

This invention relates generally to semiconductor device manufacturing and, more particularly, to a method and apparatus for controlling copper barrier/seed deposition processes.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a group of wafers, sometimes referred to as a "lot," using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can create non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates-a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. In modern semiconductor devices, copper is increasingly becoming the material of choice for forming conductive interconnections on an integrated circuit device. This is due, in large part, to the enhanced electrical characteristics of copper as compared to other materials, e.g., aluminum, previously used to form such interconnections. Because copper is not readily etched by chemical means, various techniques, such as single damascene and dual damascene, have been employed in forming conductive interconnections comprised of copper. In general, such processes involve forming a patterned layer of insulating material having multiple openings, such as trench interconnect lines or interconnect vias, formed therein, forming a barrier metal layer above the patterned insulating layer and in the openings, forming a copper seed layer above the barrier metal layer, performing an electroplating process to deposit a bulk copper layer above the copper seed layer and, thereafter, performing one or more chemical mechanical polishing processes to remove the excess copper and barrier material from above the patterned insulating layer.

During this process of forming copper conductive interconnections, variations in the thickness of the barrier metal layer and/or the copper seed layer may cause variations in the thickness of the bulk copper layer deposited by the electroplating process. That is, the bulk copper layer may be, for example, thicker in a center region of a wafer than at an edge region of the wafer. In turn, such variations may be problematic with respect to the chemical mechanical polishing processes in that such processes may take more time to complete, and/or may result in uneven removal, dishing and/or erosion of the bulk copper layer.

Additionally, the processes used to form the barrier metal layer and the copper seed layer are very complex and involve many variables that may impact the quality of the resulting barrier metal layer and/or copper seed layer. Typically, the barrier metal layer and copper seed layer are formed by performing a known "recipe" in the appropriate process tool. However, for a variety of reasons, the parameters of the recipe, e.g., DC/RF power, gas flow rates, pressure, voltage levels, DC bias, temperature (both heating and cooling), etc., tend to drift during the course of manufacturing multiple lots of wafers. Such process variations, albeit relatively small in magnitude, may adversely impact the ability to produce barrier metal layers and copper seed layers of the desired quality and consistency such that the processes used to form the copper interconnections in modem integrated circuit devices are not adversely impacted.

The present invention is directed to overcoming, or at least reducing the effects of, one or more of the problems set forth above.

SUMMARY OF THE INVENTION

The present invention is generally directed to various methods of controlling copper barrier/seed deposition processes, and a system for accomplishing same. In one illustrative embodiment, the method comprises performing at least one process operation to form a barrier metal layer and a copper seed layer above a wafer, sensing at least one parameter of at least one process operation and determining an acceptability metric for the barrier metal layer and the copper seed layer based upon the sensed parameter. In some embodiments, the method further comprises modifying at least one parameter of the process operation to be performed to form a barrier metal layer and a copper seed layer on a subsequently processed wafer based upon the determined acceptability metric. In some embodiments, the method further comprises identifying a wafer as unacceptable if the acceptability metric falls below a preselected level. In some embodiments, the acceptability metric may be determined by accessing a model that correlates the sensed parameter(s) to an acceptability metric for the barrier metal layer and the copper seed layer.

The present invention is also directed to a system that may be used to form a barrier metal layer/copper seed layer. In one embodiment, the system is comprised of a process tool that is adapted to perform at least one process operation, e.g., a degas process, an etch process, a barrier metal deposition process and/or a copper seed deposition process, to form a barrier metal layer and a copper seed layer. The system further comprises a controller that is adapted to access a model to determine an acceptability metric for the barrier metal layer and copper seed layer based upon at least one sensed process parameter for at least one of the process operations performed in forming the barrier metal layer and copper seed layer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of controlling barrier/seed deposition processes, and an apparatus for accomplishing same. As will be readily apparent to those skilled in the art upon a complete reading of the present application, the present methods are applicable to a variety of technologies, e.g., NMOS, PMOS, CMOS, SOI, etc., and to the formation of a variety of devices, including, but not limited to, logic devices, memory devices, etc.

Figure 1:
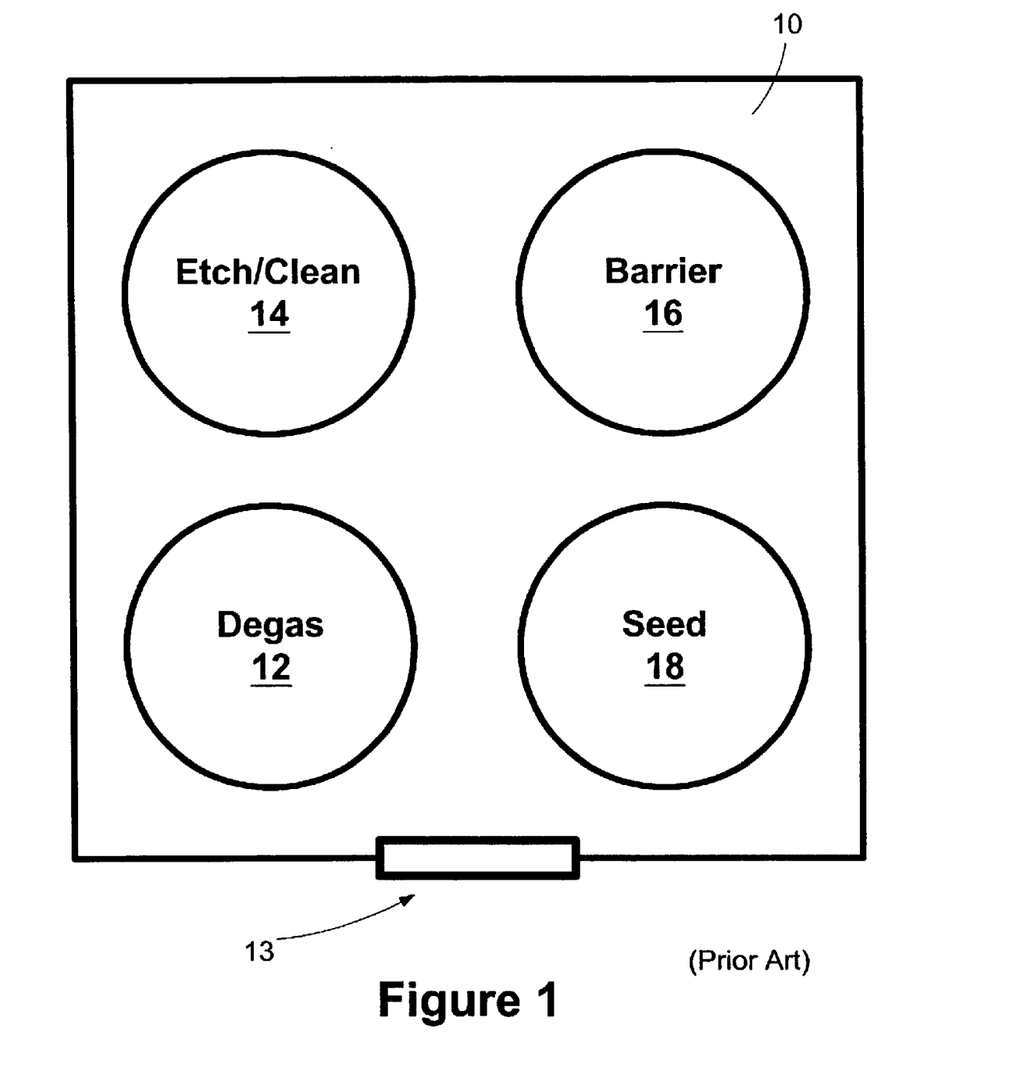
FIG. 1 is a schematic depiction of an illustrative prior art process tool that may be used with the present invention.

FIG. 1 is a schematic depiction of an illustrative process tool 10 that may be used in forming a barrier metal layer and/or copper seed layer in accordance with one illustrative embodiment of the present invention as described herein. In general, the barrier/seed tool 10 is comprised of partial or multiple sets of process chambers including a degas chamber 12, an etch chamber 14, a barrier metal layer deposition chamber 16 and a copper seed layer deposition chamber 18. It should also be noted that the entire tool 10 is controlled under vacuum. Wafers are transferred into and out of the tool 10 via load/unload port 13. Illustrative tools that may be used with the present invention include commercially-available metal deposition systems, such as an Applied Materials 5500 and a Novellus INOVA. Of course, as will be understood by those skilled in the art after a complete reading of the present application, the present invention may be employed with a variety of different process tools. Additionally, all of the functions described herein need not be performed in a single process tool. The various functions performed in the various chambers of the barrier/seed tool 10 will be described after a brief discussion of an illustrative prior art process flow for forming interconnections in an integrated circuit device, as depicted in FIGS. 2A–2E.

Figure 2A:
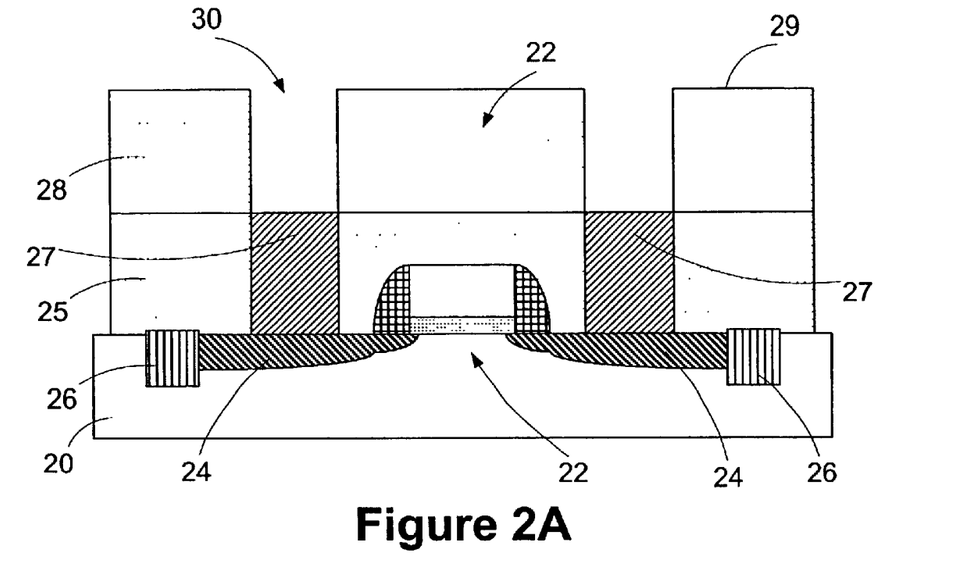
FIGS. 2A–2E depict one illustrative prior art process flow for forming conductive interconnections comprised of copper.

As shown in FIG. 2A, a transistor 22 is formed above a substrate 20 between isolation regions 26. The transistor 22 is comprised of source/drain regions 24. Also depicted in FIG. 2A is a patterned layer of insulating material 25 having a plurality of conductive trenches or contacts 27 formed therein. As will be recognized by those skilled in the art, the conductive contacts 27 provide electrical contact to the source/drain regions 24 of the transistor 22. The materials used to form the components depicted in FIG. 2A, as well as the methods of making such components, are generally well-known to those skilled in the art and will not be described herein in any greater detail. For example, the conductive contacts 27 may be comprised of a variety of materials, e.g., tungsten, and they may be formed by a variety of known techniques. The size, shape and number of the conductive contacts 27 may also vary. Although not depicted in the drawings, a barrier/glue layer of metal, e.g., titanium, may be formed in the openings in the patterned layer of insulating material 25 prior to forming the conductive contacts 27. Additionally, although the present invention is initially described in the context of forming conductive interconnections 36A (see FIG. 2E) that contact the conductive contacts 27, those skilled in the art, after reading the entirety of the present application, will understand that the methods of the present invention may be employed to form conductive interconnections at any level of an integrated circuit device using a variety of techniques, such as single or dual damascene integration techniques.

Initially, a patterned layer of insulating material 28, having a plurality of openings 30 formed therein, is formed above the layer of insulating material 25 and the conductive contacts 27. The patterned layer of insulating material 30 may be comprised of a high-K (K>5) material, a low-K (2.5<K<5.0) material, or an ultra low-K (K<2.5) material, and it may be formed by a variety of processing methods, e.g., atomic layer deposition (ALD), chemical vapor deposition (CVD), spin-on dielectric (SOD), etc. Alternatively, a multi-film composite stack could be used which would include combinations of the above films and could include an etch stop layer, a middle etch stop, a cap layer, a pore seal layer, etc. The openings 30 in the patterned layer of insulating material 28 may be formed by performing one or more etching processes in an etch tool (not shown). Thereafter, the substrate 20, with the patterned layer of insulation material 28 formed thereabove, is positioned in the vacuum isolated tool 10 where a degas process, an etch/clean process, a barrier metal deposition process, and a copper seed deposition process are performed.

More specifically, the degas process is performed in the degas chamber 12, wherein the wafer 20 is heated under vacuum to a temperature range of approximately 150–450° C. for approximately 30–240 seconds. The purpose of the degas process is to remove, outgas or drive off a variety of different residual materials that may be present on or in the patterned insulating material 28, such as water (as $H_2O$ or OH), CO, $CO_2$, $F_2$, hydrocarbons, etc. Then, the wafer 20 is vacuum-transferred to the etch/clean chamber 14, where any residual contamination, hydrocarbons, polymers or oxides covering any important contact regions are removed by sputter etching the wafer 20.

Figure 2B:
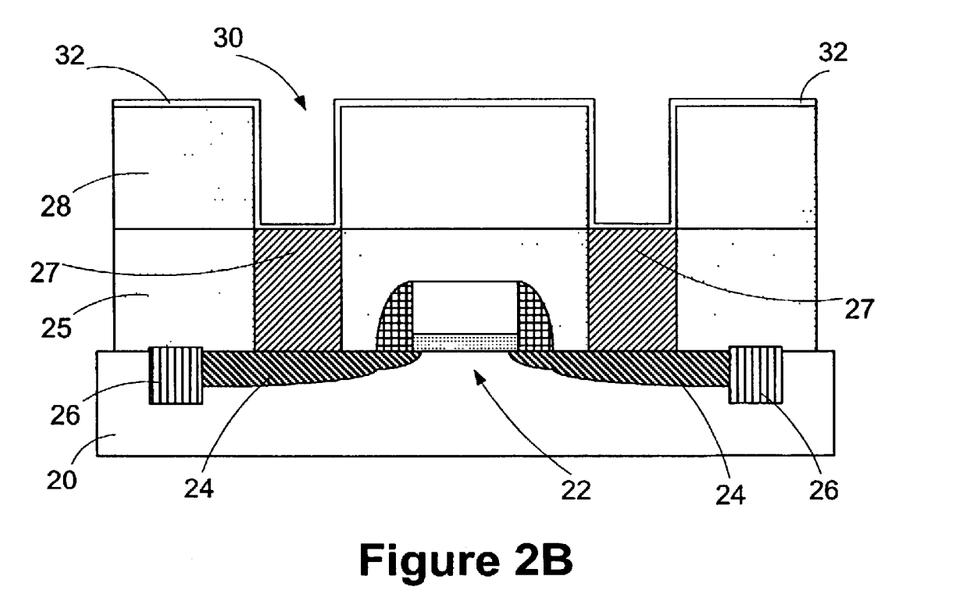

Once the wafer 20 has been cleaned in the etch/clean chamber 14, the wafer 20 is transferred under vacuum to the barrier metal deposition chamber 16, where a process is performed to deposit the barrier metal layer 32 shown in FIG. 2B. The barrier metal layer 32 is deposited above the patterned insulating layer 28 and in the openings 30 that were cleaned in the previous etch/clean chamber 14. The barrier metal layer 32 can be deposited by physical vapor deposition (PVD), chemical vapor deposition (CVD), atomic layer deposition (ALD) or other techniques known to those skilled in the art. This barrier metal layer 32 may be comprised of a variety of materials, e.g., tantalum, tantalum nitride, titanium, titanium nitride, titanium nitride silicon, titanium silicon nitride, tungsten, tungsten nitride, tungsten carbon nitride, etc., and it may have a thickness ranging from approximately 0.1–60 nm. The purpose of the barrier metal layer 32 is to, among other things, provide adhesion to the interlayer dielectric layers, provide wetting to the copper seed layer, and prevent migration of the copper material that forms the conductive interconnection 36A into unwanted areas of the integrated circuit device. Ideally, this barrier metal layer 32 will be as thin as possible, while still maintaining its ability to perform its intended function.

Figure 2C:
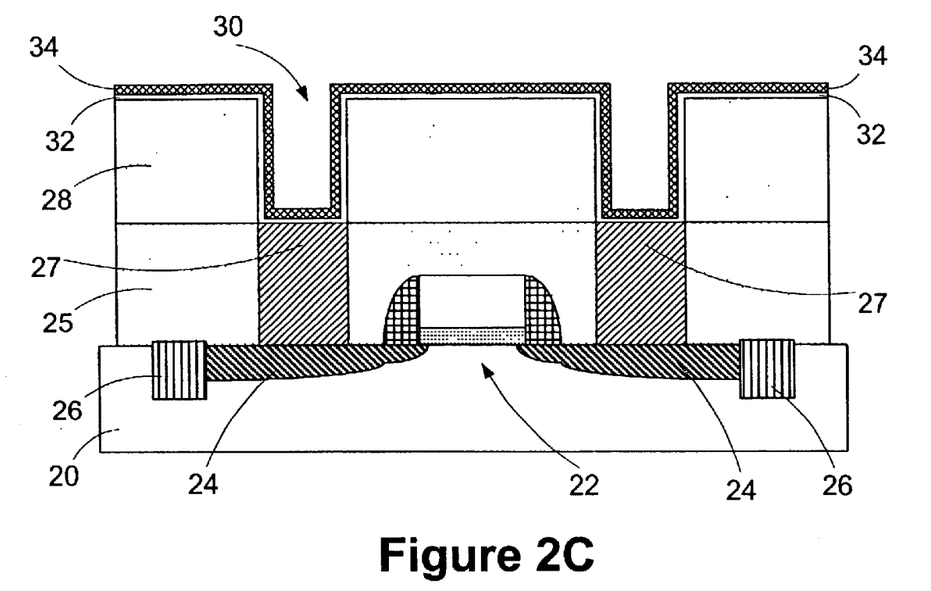
Figure 2D:
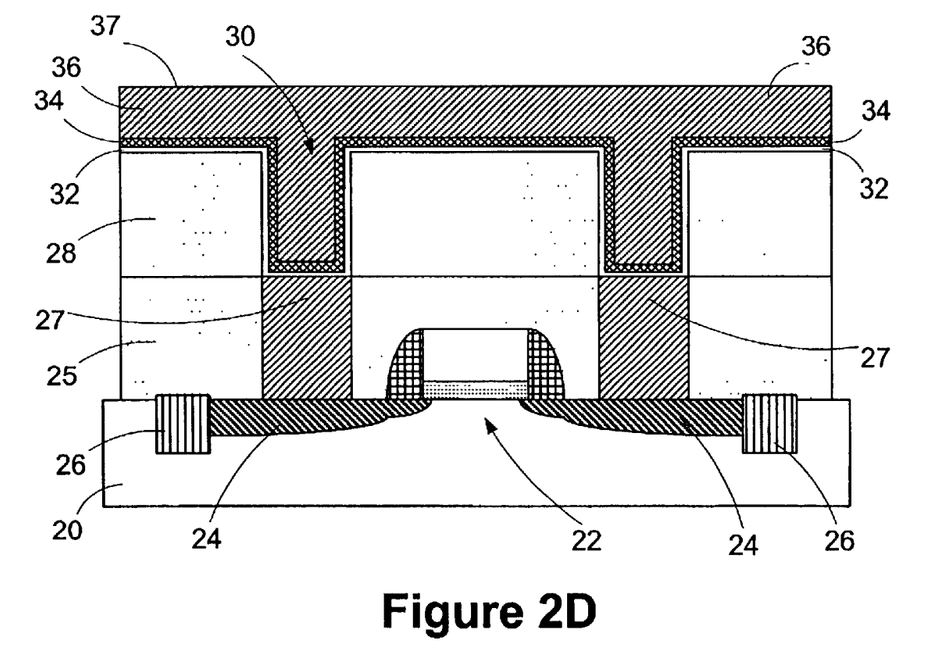
Figure 2E:
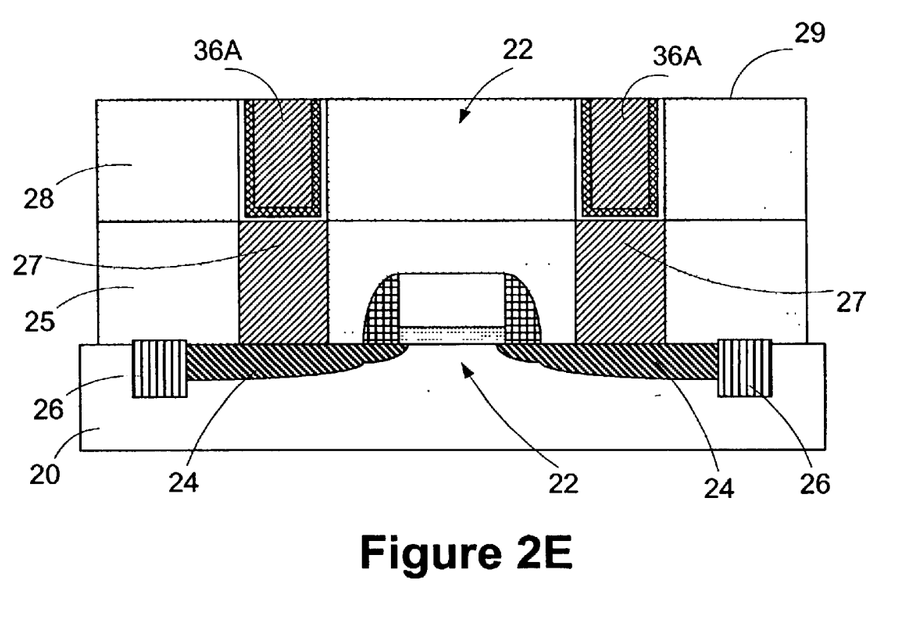

Next, the wafer 20 is sent, under vacuum, to the copper seed layer deposition chamber 18 wherein the copper seed layer 34 is deposited above the barrier metal layer 32, as depicted in FIG. 2C. The process performed in the copper seed layer deposition chamber 18 may be a PVD, CVD or ALD process, or any other technique known to those skilled in the art for forming such layers. The thickness of the copper seed layer 34 may range from approximately 20–200 nm. The copper seed layer 34 may be pure copper or it may be comprised of a copper alloy, such as copper tin, copper magnesium, copper chromium, copper calcium, etc. After the copper seed layer 34 is deposited, the wafer 20 may be removed from the barrier/seed tool 10 and an electroplating process may be performed to form a bulk copper layer 36 above the wafer 20, as shown in FIG. 2D. The techniques and method used to form the bulk copper layer 36 using electroplating processes are well-known to those skilled in the art. After the bulk copper layer 36 is formed, an anneal process may be performed, and one or more chemical mechanical polishing operations may be performed to remove the excess portions of the bulk copper layer 36, the copper seed layer 34 (to the extent it is distinguishable from the bulk copper layer 36) and the barrier metal layer 32 from above the surface 29 of the patterned layer of insulating material 28 to thereby result in the definition of the copper interconnections 36A as shown in FIG. 2E.

After the combination of the barrier metal layer 32 and copper seed layer 34 are formed, a variety of metrology tests may be performed on the layers 32, 34 in an attempt to determine the quality of the processing operations performed in the barrier/seed tool 10. For example, measurements of the sheet resistivity of the combined layers 32, 34 may be made at various locations across the wafer 20 using a four-point probe. Alternatively, thickness measurements may be made using an X-ray reflectance (XRR) tool or an X-ray fluorescence (XRF) tool. In some cases, despite all efforts to the contrary, the combined barrier metal layer 32/copper seed layer 34 may exhibit across-wafer thickness variations. That is, the combination of the barrier metal layer 32 and the copper seed layer 34 may be thinner near an edge region of the wafer 20 as compared to its thickness at the center region of the wafer 20. Such thickness variations may be inferred from variations in the sheet resistivity of the combined layers. Such thickness variations may also have adverse impacts on downstream operations. For example, during the course of the electroplating process used to form the bulk copper layer 36, such thickness variations in the barrier metal layer 32/copper seed layer 34 combination may also cause corresponding variations in the profile of the surface 37 of the bulk copper layer 36. That is, the bulk copper layer 36 may also exhibit across-wafer variations in the surface profile that are consistent with the across-wafer variations in the thickness of the barrier metal layer 32/copper seed layer 34 combination. As an even more specific example, if the barrier metal layer 32/copper seed layer 34 combination exhibits across-wafer characteristics wherein the combined layer is thinner near an edge region of the wafer 20 as compared to the thickness of the combined layer at a center region of the wafer 20, then the bulk copper layer 36 may also exhibit similar across-wafer characteristics, i.e., thinner at the edge than at the center of the wafer 20.

After the conductive interconnections 36A are formed, a variety of electrical tests and other metrology tests may be performed to again determine the adequacy or effectiveness of the processing operations performed previously. Such electrical tests may include line resistance, via resistance, capacitance, line-to-line leakage, layer-to-layer leakage, etc. Additionally, a variety of other metrology tests may be performed on the completed device to determine a variety of physical characteristics of the resulting structure. For example, the critical dimension of the conductive interconnections 36 may be measured. Unfortunately, such electrical and metrology tests may not be performed until well after additional wafers 20 have been processed in the barrier/seed tool 10. As a result, many wafers 20 may be processed in the barrier/seed tool 10 using process parameters that result in the ultimate device exhibiting undesirable electrical performance characteristics, physical characteristics and/or reliability characteristics. Thus, the manufacturing operations become less efficient and excessive waste and/or reworking may be required to produce integrated circuit devices of the desirable performance characteristics and capabilities.

Figure 3:
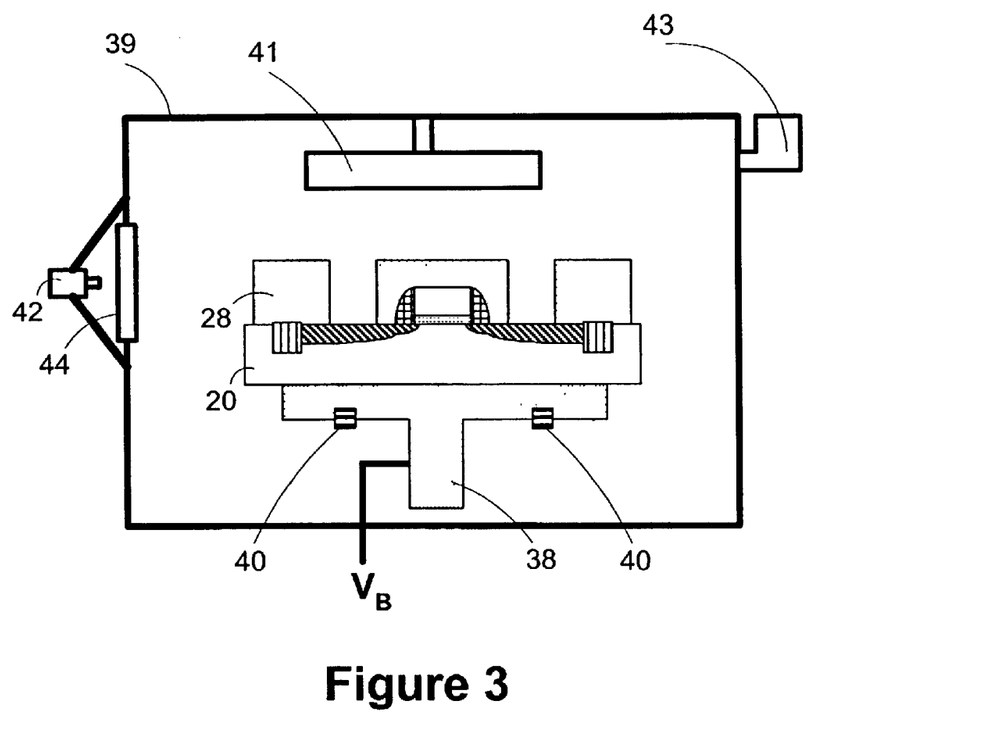
FIG. 3 is a cross-sectional view of an illustrative process chamber in accordance with one illustrative embodiment of the present invention that is part of an illustrative process tool.

FIG. 3 is an enlarged, cross-sectional, schematic view of an illustrative chamber 39 of the barrier/seed tool 10. It should be understood that the chamber 39 may be representative of any or all of the chambers 12, 14, 16, 18 of the barrier/seed tool 10. In the depicted embodiment, the chamber 39 is a PVD chamber having a wafer stage 38 and a target 41. The target 41 may be comprised of any of a variety of materials to be sputter-deposited onto the patterned layer of insulating material 28 depicted in FIG. 2A. In general, a wafer 20, having a patterned layer of insulating material 28 formed thereabove is positioned on the wafer stage 38 within the chamber 39. The wafer stage 38 is provided to, among other things, support the wafer 20 during processing operations performed in the chamber 39. At least one thermocouple 40 (two are depicted) is provided to sense the temperature of the wafer stage 38. Also depicted in FIG. 3 is an optical sensor 42 that will be used to sense the temperature of the wafer 20 in the chamber 39 through the transparent window 44 formed in the wall of the chamber 39. A residual gas analyzer (RGA) 43 may also be added to, for example, the degas chamber 12 and/or etch/clean chamber 14, to detect the amount of moisture, hydrocarbons, etc. that are being driven off the wafer 20.

In general, in some cases, i.e., in the deposition chambers 16, 18, a negative DC voltage ("$V_B$"), known as the bias voltage or bias power, is applied to the wafer stage 38 to assist in providing a desired degree of directionality with respect to the deposition of the appropriate ions during the formation of the barrier metal layer 32 and/or the copper seed layer 34. This voltage ($V_B$) may be applied by coupling the wafer stage 38 to the appropriate RF power supply. The RF power range of the applied DC bias may vary from approximately 0–1000 watts with variable on/off duty cycles. Of course, the chamber 39 depicted in FIG. 3 does not show all of the components of an actual production chamber. For example, various process gases and/or precursors may be provided to the chamber 39 via various combinations of gas outlets and manifolds that are not shown in FIG. 3. Additionally, as will be understood by those skilled in the art, if the chamber 39 were a CVD chamber, then the target 41 would not be present. Instead, one or more showerheads (not shown) would be positioned in the chamber 39 to provide the desired flow of various process gases used in such a CVD process. In the illustrative case where the chamber 39 is used to perform an ALD process, one or more gas injection inlets (not shown) would be provided on the chamber 39.

In a general sense, according to one aspect of the present invention, various process parameters of the processes performed at one or more of the chambers 12, 14, 16 and 18 of the barrier/seed tool 10 are correlated with electrical data and/or metrology data for the resulting product. In one illustrative embodiment, this correlation is established by using a multi-variant model. Using this model, an acceptability metric may be established for various combinations of the barrier metal layer 32/copper seed layer 34. That is, using one or more parameters of one or more of the processes used to form the barrier metal layer 32/copper seed layer 34, the model may be used to predict the acceptability of the barrier metal layer 32/copper seed layer 34 as it relates to the production of conductive interconnections 36A that exhibit the desired physical and electrical characteristics. The scale selected for the acceptability metric may vary. For example, in one illustrative embodiment, an acceptability metric of 1.0 indicates that the combination of the barrier metal layer 32/copper seed layer 34 is associated with the production of conductive interconnections 36A that exhibit the required electrical and/or physical characteristics. Values for the acceptability metric that are less than 1.0 indicate a degradation in the expected results in the process operations used to form the barrier metal layer 32/copper seed layer 34. If the acceptability metric falls below a determined minimum, this may be indicative of a barrier metal layer 32/copper seed layer 34 combination that is unlikely to produce acceptable conductive interconnections 36A. In this case, the wafer 20 may be scrapped or reworked.

Figure 4:
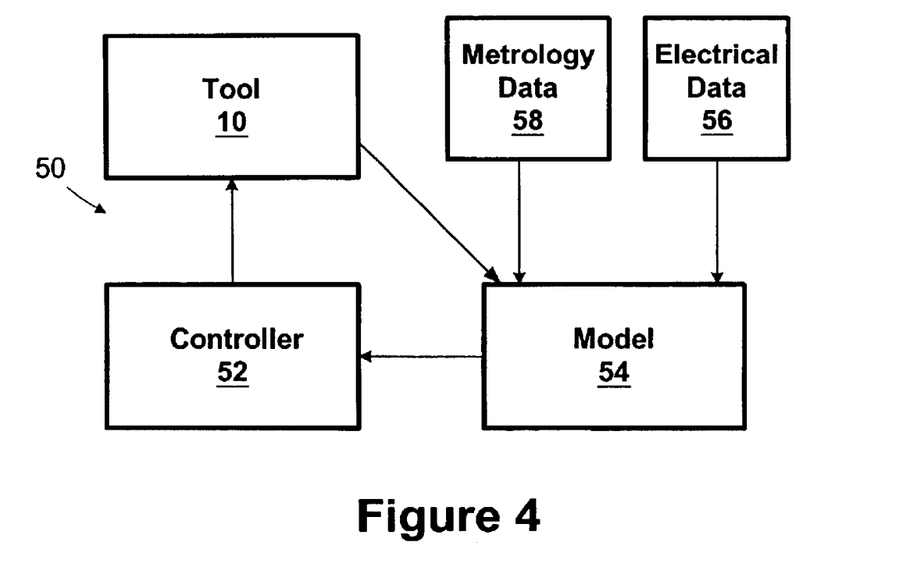
FIG. 4 is a block diagram depiction of an illustrative system in accordance with one illustrative embodiment of the present invention.

FIG. 4 is a block diagram depiction of an illustrative system 50 in accordance with one illustrative embodiment of the present invention. As shown therein, the system 50 comprises a barrier/seed tool 10, a controller 52, and a model 54. Electrical test data 56 and metrology data 58 may be provided to the model 54 to train or update the model 54 as described more fully herein. In general, the model 54 is a multi-variant model that will be used to correlate the electrical data and/or metrology data of interconnect structures and/or completed devices to one or more of the process parameters of the process operations performed in one or more of the chambers 12, 14, 16, 18. Such parameters may include, but are not limited to, forward power, reflected power, pressure, wafer stage and wafer temperatures, time, the bias voltage (VR) applied to the wafer stage 38 during the process operations performed in one or more of the chambers 12, 14, 16, 18, a flow rate of a gas used in the process operation, chamber-to-chamber queue times, a DC deposition power, an RF plasma power, a duration of the process operation, a throughput of wafers through the process operation, heating and cooling rates of the process operation, a quality of the vacuum environment, sheet resistivity ($R_S$), or the thickness bias ratio (ratio of a no bias deposited film to a bias deposited film), the results (spectra) of any residual gas analysis from one or more of the process chambers, etc. The electrical data 56 provided to the model 54 may be any of a variety of different types of electrical data obtained in forming conductive interconnections 36A comprised of copper. For example, such electrical test data may include, but should not be considered as limited to, the sheet resistance of the barrier metal layer 32/copper seed layer 34 combination, capacitance of the conductive interconnections, the via resistance of the interconnect structure, line-to-line leakage, layer-to-layer leakage, isothermal anneal sheet resistance delta, electromigration, stress migration, etc. Similarly, the metrology data 58 provided to the model 54 may be any of a variety of different types of data collected for the various components used in forming conductive interconnections 36A comprised of copper. For example, such metrology data may include, but is not limited to, sheet resistivity, density, stress, defects, adhesion, wettability, thickness and/or chemical composition of the barrier metal layer 32 and/or the copper seed layer 34, the critical dimension of the resulting conductive interconnections 36A, void density of filled features, step coverage (side wall and bottom thickness), overhang, profile shape and slope, copper agglomeration or roughness, copper erosion/dishing, metal height/width, etc.

The model 54 may be developed empirically using commonly known linear or nonlinear techniques. The control model may be a relatively simple equation based model (e.g., linear, exponential, weighted average, etc.) or a more complex model, such as a neural network model, principal component analysis (PCA) model, partial least squares projection to latent structures (PLS) model. The specific implementation of the model may vary depending on the modeling technique selected.

The model may be consulted to determine the acceptability metric of the barrier metal layer 32/copper seed layer 34 based upon the monitored process parameters used in forming the barrier metal layer 32/copper seed layer 34 combination in the barrier/seed tool 10. That is, based upon the sensed process parameters of one or more of the chambers 12, 14, 16, 18 of the barrier/seed tool 10, the model may be accessed to determine an acceptability metric for the barrier metal layer 32/copper seed layer 34. Based upon the acceptability metric, one or more parameters of the process operations performed in one or more of the chambers 12, 14, 16, 18 may be adjusted if the determined acceptability metric is not within acceptable limits. For example, the duration, temperature, power or pressure of the process, spacing of the wafer 20 from the target 41 or gas injection source, the temperature of the patterned layer of insulating material 28 formed above the wafer 20, the temperature of the wafer stage 38 positioned in the chamber, etc., may be determined or adjusted. As a result, better process control may be achieved with respect to the operation of the barrier/seed tool 10, thereby resulting in more efficient manufacturing operations and less waste.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The present invention is generally directed to a method and apparatus for controlling copper barrier/seed deposition processes. In one illustrative embodiment, the method comprises performing at least one process operation to form a barrier metal layer and a copper seed layer above a wafer, sensing at least one parameter of at least one process operation and determining an acceptability metric for the barrier metal layer and the copper seed layer based upon the sensed at least one parameter. In some embodiments, the method further comprises modifying at least one parameter of said at least one process operation to be performed to form a barrier metal layer and a copper seed layer on a subsequently processed wafer based upon said determined acceptability metric. In some embodiments, the method further comprises identifying a wafer as unacceptable if said acceptability metric falls below a preselected level. In some embodiments, the acceptability metric may be determined by accessing a model that correlates the sensed parameter(s) to an acceptability metric for the barrier metal layer and the copper seed layer. In some cases, the sensed parameter(s) is comprised of at least one of a temperature of the wafer 20, a temperature of the wafer stage 38, the voltage ($V_B$) applied to the wafer stage 38, a flow rate of a gas used in a process operation, a residual gas analysis spectra, a DC deposition power, an RF plasma power, the duration of a process, the throughput of wafers through one or more chambers, chamber-to-chamber queue time, the rate of cooling and/or heating of one or more of the chambers, chamber idle time or vacuum quality.

The present invention is also directed to a system that may be used to form a barrier metal layer 32/copper seed layer 34. In one embodiment, the system is comprised of a process tool 10 that is adapted to perform at least one process operation, e.g., a degas process, an etch process, a barrier metal deposition process and/or a copper seed deposition process, to form a barrier metal layer 32 and a copper seed layer 34. The system further comprises a controller that is adapted to access a model to determine an acceptability metric for the barrier metal layer 32 and copper seed layer 34 based upon at least one sensed process parameter for at least one of the process operations performed in forming the barrier metal layer 32 and copper seed layer 34.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing at least one process operation to form a barrier metal layer and a copper seed layer above a wafer;
    sensing at least one parameter of said at least one process operation; and
    determining an acceptability metric for said barrier metal layer and said copper seed layer based upon said sensed at least one parameter by accessing a model that correlates said sensed at least one parameter to an acceptability metric for said barrier metal layer and said copper seed layer.

2. The method of claim 1, further comprising modifying at least one parameter of said at least one process operation to be performed to form a barrier metal layer and a copper seed layer on a subsequently processed wafer based upon said determined acceptability metric.

3. The method of claim 1, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

4. The method of claim 1, wherein sensing at least one parameter of said at least one process operation comprises sensing at least one parameter of said at least one process operation, said at least one parameter comprised of at least one of a temperature of said wafer, a temperature of a wafer stage said wafer is positioned above, a voltage applied to said wafer stage, a flow rate of a gas used in said at least one process operation, a residual gas analysis spectra, a DC deposition power, an RF plasma power, a duration of said process operation, an throughput of wafers through said process operation, chamber-to-chamber queue time, a cooling rate of said process operation, and a heating rate of said process operation.

5. The method of claim 1, wherein said correlation established by said model is based upon at least one of electrical test data and physical test data.

6. The method of claim 1, further comprising identifying a wafer as unacceptable if said acceptability metric falls below a preselected level.

7. The method of claim 1, wherein said barrier metal layer is comprised of at least one of tantalum, tantalum nitride, titanium, titanium nitride, titanium nitride silicon, titanium silicon nitride, tungsten, tungsten nitride and tungsten carbon nitride.

8. A method, comprising:
    performing at least one process operation to form a barrier metal layer and a copper seed layer above a wafer;
    sensing at least one parameter of said at least one process operation;
    determining an acceptability metric for said barrier metal layer and said copper seed layer based upon said sensed at least one parameter by accessing a model that correlates said sensed at least one parameter to an acceptability metric for said barrier metal layer and said copper seed layer; and
    modifying at least one parameter of said at least one process operation to be performed to form a barrier metal layer and a copper seed layer on a subsequently processed wafer based upon said determined acceptability metric.

9. The method of claim 8, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

10. The method of claim 8, wherein sensing at least one parameter of said at least one process operation comprises sensing at least one parameter of said at least one process operation, said at least one parameter comprised of at least one of a temperature of said wafer, a temperature of a wafer stage said wafer is positioned above, a voltage applied to said wafer stage, a flow rate of a gas used in said at least one process operation, a residual gas analysis spectra, a DC deposition power, an RF plasma power, a duration of said process operation, an throughput of wafers through said process operation, chamber-to-chamber queue time, a cooling rate of said process operation, and a heating rate of said process operation.

11. The method of claim 8, wherein said correlation established by said model is based upon at least one of electrical test data and physical test data.

12. The method of claim 8, further comprising identifying a wafer as unacceptable if said acceptability metric falls below a preselected level.

13. The method of claim 8, wherein said barrier metal layer is comprised of at least one of tantalum, tantalum nitride, titanium, titanium nitride, titanium nitride silicon, titanium silicon nitride, tungsten, tungsten nitride and tungsten carbon nitride.

14. The method of claim 8, wherein sensing at least one parameter of said at least one process operation comprises sensing a temperature of said wafer using an optical metrology tool.

15. The method of claim 8, wherein sensing at least one parameter of said at least one process operation comprises sensing a voltage applied to a wafer stage during a deposition process used to form at least one of said barrier metal layer and said copper seed layer by monitoring at least one of a forward power, a reflected power, and a bias voltage of said process operation.

16. A method, comprising
    performing at least one process operation to form a barrier metal layer and a copper seed layer above a wafer;
    sensing at least one parameter of said at least one process operation;
    determining an acceptability metric for said barrier metal layer and said copper seed layer based upon said sensed at least one parameter by accessing a model that correlates said sensed at least one parameter to an acceptability metric for said barrier metal layer and said copper seed layer; and identifying a wafer as unacceptable if said acceptability metric falls below a preselected level.

17. The method of claim 16, further comprising modifying at least one parameter of said at least one process operation to be performed to form a barrier metal layer and a copper seed layer on a subsequently processed wafer based upon said determined acceptability metric.

18. The method of claim 16, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

19. The method of claim 16, wherein sensing at least one parameter of said at least one process operation comprises sensing at least one parameter of said at least one process operation, said at least one parameter comprised of at least one of a temperature of said wafer, a temperature of a wafer stage said wafer is positioned above, a voltage applied to said wafer stage, a flow rate of a gas used in said at least one process operation, a residual gas analysis spectra, a DC deposition power, an RF plasma power, a duration of said process operation, an throughput of wafers through said process operation, chamber-to-chamber queue time, a cooling rate of said process operation, and a heating rate of said process operation.

20. The method of claim 16, wherein said correlation established by said model is based upon at least one of electrical test data and physical test data.

21. The method of claim 16, wherein said barrier metal layer is comprised of at least one of tantalum, tantalum nitride, titanium, titanium nitride, titanium nitride silicon, titanium silicon nitride, tungsten, tungsten nitride and tungsten carbon nitride.

22. The method of claim 16, wherein sensing at least one parameter of said at least one process operation comprises sensing a temperature of said wafer using an optical metrology tool.

23. The method of claim 16, wherein sensing at least one parameter of said at least one process operation comprises sensing a voltage applied to a wafer state during a deposition process used to form at least one of said barrier metal layer and said copper seed layer by monitoring at least one of a forward power, a reflected power, and a bias voltage of said process operation.

24. A method, comprising:
performing at least one process operation to form a barrier metal layer and a copper seed layer above a wafer;
sensing at least one parameter of said at least one process operation by performing a residual gas analysis during said at least one process operation; and
determining an acceptability metric for said barrier metal layer and said copper seed layer based upon said sensed at least one parameter.

25. The method of claim 24, further comprising modifying at least one parameter of said at least one process operation to be performed to form a barrier metal layer and a copper seed layer on a subsequently processed wafer based upon said determined acceptability metric.

26. The method of claim 24, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer diposition process.

27. The method of claim 24, wherein determining an acceptability metric for said barrier metal layer and said copper seed layer based upon said sensed at least one parameter comprises accessing a model that correlates said sensed at least one parameter to an acceptability metric for said barrier metal layer and said copper seed layer.

28. The method of claim 27, wherein said correlation established by said model is based upon at least one of electrical test data and physical test data.

29. The method of claim 24, further comprising identifying a wafer as unacceptable if said acceptability metric falls below a preselected level.

30. A method, comprising:
performing at least one process operation to form a barrier metal layer and a copper seed layer above a wafer;
sensing a temperature of a wafer stage that supports said wafer based upon an output from at least one thermocouple coupled to said wafer stage; and
determining an acceptability metric for said barrier metal layer and said copper seed layer based upon said sensed temperature.

31. The method of claim 30, further comprising modifying at least one parameter of said at least one process operation to be performed to form a barrier metal layer and a copper seed layer on a subsequently processed water based upon said determined acceptibility metric.

32. The method of claim 30, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

33. The method of claim 30, wherein determining an acceptability metric for said barrier metal layer and said copper seed layer based upon said sensed temperature comprises accessing a model that correlates said sensed temperature to an acceptability metric for said barrier metal layer and said copper seed layer.

34. The method of claim 33, wherein said correlation established by said model is based upon at least one of electrical test data and physical test data.

35. The method of claim 30, further comprising identifying a wafer as unacceptable if said acceptability metric falls below a preselected level.

36. A method, comprising:
performing at least one process operation to form a barrier metal layer and a copper seed layer above a wafer;
sensing at least one parameter of said at least one process operation by performing a residual gas analysis during said at least one process operation;
determining an acceptability metric for said barrier metal layer and said copper seed layer based upon said sensed at least one parameter by accessing a model that correlates said sensed at least one parameter to an acceptability metric for said barrier metal layer and said copper seed layer; and
modifying at least one parameter of said at least one process operation to be performed to form a barrier metal layer and a copper seed layer on a subsequently processed wafer based upon said determined acceptability metric.

37. The method of claim 36, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

38. The method of claim 36, wherein said correlation established by said model is based upon at least one of electrical test data and physical test data.

39. The method of claim 36, further comprising identifying a wafer as unacceptable if said acceptability metric falls below a preselected level.

40. A method, comprising:
performing at least one process operation to form a barrier metal layer and a copper seed layer above a wafer;
sensing a temperature of a wafer stage that supports said wafer based upon an output from at least one thermocouple coupled to said wafer stage,
determining an acceptability metric for said barrier metal layer and said copper seed layer based upon said sensed temperature by accessing a model that correlates said sensed temperature to an acceptability metric for said barrier metal layer and said copper seed layer, and
modifying at least one parameter of said at least one process operation to be performed to form a barrier metal layer and a copper seed layer on a subsequently processed wafer based upon said determined acceptability metric.

41. The method of claim 40, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

42. The method of claim 40, wherein said correlation established by said model is based upon at least one of electrical test data and physical test data.

43. The method of claim 40, further comprising identifying a wafer as unacceptable if said acceptability metric falls below a preselected level.

44. A method, comprising:
performing at least one process operation to form a barrier metal layer and a copper seed layer above a wafer;
sensing at least one parameter of said at least one process operation by performing a residual gas analysis during said at least one process operation;
determining an acceptability metric for said barrier metal layer and said copper seed layer based upon said sensed at least one parameter by accessing a model that correlates said sensed at least one parameter to an acceptability metric for said barrier metal layer and said copper seed layer; and
identifying a wafer as unacceptable if said acceptability metric falls below a preselected level.

45. The method of claim 44, further comprising modifying at least one parameter of said at least one process operation to be performed to form a barrier metal layer and a copper seed layer on a subsequently processed wafer based upon said determined acceptability metric.

46. The method of claim 44, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

47. The method of claim 44, wherein said correlation established by said model is based upon at least one of electrical test data and physical test data.

48. A method, comprising:
performing at least one process operation to form a barrier metal layer and a copper seed layer above a wafer;
sensing a temperature of a wafer stage that supports said wafer based upon an output from at least one thermocouple coupled to said wafer stage;
determining an acceptability metric for said barrier metal layer and said copper seed layer based upon said sensed temperature by accessing a model that correlates said sensed temperature to an acceptability metric for said barrier metal layer and said copper seed layer; and
identifying a wafer as unacceptable if said acceptability metric falls below a preselected level.

49. The method of claim 48, further comprising modifying at least one parameter of said at least one process operation to be performed to form a barrier metal layer and a copper seed layer on a subsequently processed wafer based upon said determined acceptability metric.

50. The method of claim 48, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process a barrier metal deposition process and a copper seed layer deposition process.

51. The method of claim 48, wherein said correlation established by said model is based upon at least one of electrical test data and physical test data.

52. A method, comprising:
performing at least one process operation to form a barrier metal layer and a copper seed layer above a wafer;
sensing a temperature of said wafer using an optical metrology tool; and
determining an acceptability metric for said barrier metal layer and said copper seed layer based upon said sensed temperature.

53. The method of claim 52, further comprising modifying at least one parameter of said at least one process operation to be performed to form a barrier metal layer and a copper seed layer on a subsequently processed wafer based upon said determined acceptability metric.

54. The method of claim 52, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

55. The method of claim 52, wherein determining an acceptability metric for said barrier metal layer and said copper seed layer based upon said sensed temperature comprises accessing a model that correlates said sensed temperature to an acceptability metric for said barrier metal layer and said copper seed layer.

56. The method of claim 55, wherein said correlation established by said model is based upon at least one of electrical test data and physical test data.

57. The method of claim 52, further comprising identifying a wafer as unacceptable if said acceptability metric falls below a preselected level.

58. A method, comprising:

performing at least one process operation to form a barrier metal layer and a copper seed layer above a wafer;

sensing a voltage applied to a wafer stage during a deposition process used to form at least one of said barrier metal layer and said copper seed layer by monitoring at least one of a forward power, a reflected power, and a bias voltage of said process operation; and determining an acceptability metric for said barrier metal layer and said copper seed layer based upon said sensed at least one parameter.

59. The method of claim 58, further comprising modifying at least one parameter of said at least one process operation to be performed to form a barrier metal layer and a copper seed layer on a subsequently processed wafer based upon said determined acceptability metric.

60. The method of claim 58, wherein performing at least one process operation to form a barrier metal layer and a copper seed layer above a wafer comprises performing at least one process operation to form a barrier metal layer and a copper seed layer above a wafer, said at least one process operation comprised of a degas process, an etch process, a barrier metal deposition process and a copper seed layer deposition process.

61. The method of claim 58, wherein determining an acceptability metric for said barrier metal layer and said copper seed layer based upon said sensed at least one parameter comprises accessing a model that correlates said sensed at least one parameter to an acceptability metric for said barrier metal layer and said copper seed layer.

62. The method of claim 61, wherein said correlation established by said model is based upon at least one of electrical test data and physical test data.

63. The method of claim 58, further comprising identifying a water as unacceptable if said acceptability metric falls below a preselected level.

\* \* \* \* \*

UNITED STATES PATENT AND TRADEMARK OFFICE
CERTIFICATE OF CORRECTION

PATENT NO.    : 6,800,494 B1
DATED         : October 5, 2004
INVENTOR(S)   : Howard Ernest Castle and William S. Brennan It is certified that error appears in the above-identified patent and that said Letters Patent is hereby corrected as shown below:

Column 13,
Line 43, "wafer state" should be -- wafer stage --.

Column 14,
Line 2, "diposition" should be -- deposition --.
Line 27, "water" should be -- wafer --.
Line 28, "acceptibility" should be -- acceptability --.

Column 18,
Line 16, "water" should be -- wafer --.

Signed and Sealed this

First Day of February, 2005

JON W. DUDAS
*Director of the United States Patent and Trademark Office*